United States Patent
Fang et al.

(10) Patent No.: US 8,008,686 B2
(45) Date of Patent: Aug. 30, 2011

(54) LIGHT EMITTING DIODE CHIP

(75) Inventors: Kuo-Lung Fang, Hsinchu County (TW); Chien-Sen Weng, Hsinchu County (TW); Chih-Wei Chao, Taipei (TW)

(73) Assignee: Lextar Electronics Corp., Hsinchu (TW)

( * ) Notice: Subject to any disclaimer, the term of this patent is extended or adjusted under 35 U.S.C. 154(b) by 312 days.

(21) Appl. No.: 12/204,815

(22) Filed: Sep. 5, 2008

(65) Prior Publication Data

US 2010/0012970 A1 Jan. 21, 2010

(30) Foreign Application Priority Data

Jul. 15, 2008 (TW) .............................. 97126798 A

(51) Int. Cl.
*H01L 33/00* (2010.01)
(52) U.S. Cl. ... 257/102; 257/99; 257/103; 257/E33.001; 438/45
(58) Field of Classification Search .................. 257/99, 257/102, 103, E33.001, E21.001
See application file for complete search history.

(56) References Cited

U.S. PATENT DOCUMENTS

| | | | |
|---|---|---|---|
| 5,753,940 A * | 5/1998 | Komoto | 257/95 |
| 6,255,129 B1 | 7/2001 | Lin | |
| 6,298,079 B1 | 10/2001 | Tanaka et al. | |
| 6,518,958 B1 * | 2/2003 | Miyajima et al. | 345/173 |
| 6,890,340 B2 | 5/2005 | Duane | |
| 7,075,115 B2 | 7/2006 | Sakamoto et al. | |
| 7,777,242 B2 * | 8/2010 | Yoneda | 257/98 |
| 2003/0160229 A1 * | 8/2003 | Narayan et al. | 257/14 |

FOREIGN PATENT DOCUMENTS

JP 2005277152 10/2005

* cited by examiner

*Primary Examiner* — Thinh Nguyen
(74) *Attorney, Agent, or Firm* — Jianq Chyun IP Office

(57) ABSTRACT

An LED chip includes a substrate, a semiconductor device layer, a wall structure, and a number of electrodes. The semiconductor device layer is disposed on the substrate and includes a first-type doped semiconductor layer disposed on the substrate, an active layer disposed on a portion of the first-type doped semiconductor layer, and a second-type doped semiconductor layer disposed on the active layer and having a first top surface. The wall structure is disposed on the first-type doped semiconductor layer that is not covered by the active layer and surrounds the active layer. Besides, the wall structure has a second top surface higher than the first top surface of the second-type doped semiconductor layer. Additionally, the electrodes are disposed on and electrically connected with the first-type doped semiconductor layer and the second-type doped semiconductor layer.

12 Claims, 16 Drawing Sheets

LIGHT EMITTING DIODE CHIP

CROSS-REFERENCE TO RELATED APPLICATION

This application claims the priority benefit of Taiwan application serial no. 97126798, filed on Jul. 15, 2008. The entirety of the above-mentioned patent application is hereby incorporated by reference herein and made a part of specification.

BACKGROUND OF THE INVENTION

1. Field of the Invention

The present invention relates to a light emitting diode (LED) chip, and more particularly to an LED chip characterized by satisfactory light emitting efficiency.

2. Description of Related Art

With a progress in semiconductor technologies, an LED now has advantages of high luminance, low power consumption, compactness, low driving voltage, mercury free, and so forth. Therefore, the LED has been extensively applied in the field of displays and illumination. Generally, light emitting efficiency of the LED is mainly determined upon internal quantum efficiency and external quantum efficiency (light extraction efficiency) of an active layer in the LED. Epitaxial quality of a semiconductor layer and a method of stacking film layers for forming the semiconductor layer contribute to the favorable internal quantum efficiency, while the enhancement of the external quantum efficiency is achieved when light emitted by an LED chip is effectively propagated. Namely, the external quantum efficiency is associated with external optical designs of the LED chip.

FIG. 1A is a top view of a conventional LED chip, and FIG. 1B is a schematic cross-sectional view taken along a section line I-I depicted in FIG. 1A. Referring to FIGS. 1A and 1B, a conventional LED chip 100 includes a substrate 110, a semiconductor device layer 120, an N-type electrode 130a, and a P-type electrode 130b. The semiconductor device layer 120 is disposed on the substrate 110 and includes an N-type semiconductor layer 122, an active layer 124, and a P-type semiconductor layer 126. The N-type semiconductor layer 122 is disposed on the substrate 110. The active layer 124 is disposed on a portion of the N-type semiconductor layer 122. The P-type semiconductor layer 126 is disposed on the active layer 124. Besides, the N-type electrode 130a is disposed on the N-type semiconductor layer 122 and has a favorable ohmic contact with the N-type semiconductor layer 122. By contrast, the P-type electrode 130b is disposed on the P-type semiconductor layer 126 and has a favorable ohmic contact with the P-type semiconductor layer 126.

It can be observed from FIGS. 1A and 1B that light L' emitted from the active layer 124 of the LED chip 100 is transmitted toward various directions. Nonetheless, when the LED chip 100 is applied to the filed of displays and illumination, the light emitted by the LED chip 100 is often concentrated within a certain range, so as to provide a highly directional LED in which an angle of dispersion is relatively small. Therefore, how to utilize the light transmitted toward different directions in an effective manner has become an essential topic.

SUMMARY OF THE INVENTION

The present invention is directed to an LED chip with favorable external quantum efficiency.

The present invention is further directed to a fabricating method of an LED chip. The fabricating method is suitable for manufacturing the aforesaid LED chip with favorable external quantum efficiency.

The present invention provides an LED chip including a substrate, a semiconductor device layer, a wall structure, and a plurality of electrodes. The semiconductor device layer is disposed on the substrate and includes a first-type doped semiconductor layer, an active layer, and a second-type doped semiconductor layer. The first-type doped semiconductor layer is disposed on the substrate. The active layer is disposed on a portion of the first-type doped semiconductor layer. The second-type doped semiconductor layer is disposed on the active layer and has a first top surface. The wall structure is disposed on the first-type doped semiconductor layer that is not covered by the active layer. Besides, the wall structure surrounds the active layer and has a second top surface higher than the first top surface of the second-type doped semiconductor layer. The electrodes are disposed on and electrically connected with the first-type doped semiconductor layer and the second-type doped semiconductor layer.

In an embodiment of the present invention, the substrate is, for example, an aluminum oxide substrate or other appropriate substrates.

In an embodiment of the present invention, the first-type doped semiconductor layer is an N-type semiconductor layer, while the second-type doped semiconductor layer is a P-type semiconductor layer. It is of certain that the first-type doped semiconductor layer can also be a P-type semiconductor layer, while the second-type doped semiconductor layer can be an N-type semiconductor layer.

In an embodiment of the present invention, the active layer is a multiple quantum well (MQW) active layer.

In an embodiment of the present invention, the wall structure is in a form of a continuous pattern.

In an embodiment of the present invention, the wall structure includes a semiconductor epitaxial layer and a cap layer. The semiconductor epitaxial layer has a third top surface substantially aligned to the first top surface of the second-type doped semiconductor layer. The cap layer at least covers a portion of the third top surface. In a preferred embodiment of the present invention, the cap layer is, for example, a dielectric layer or a conductive layer.

In an embodiment of the present invention, the LED chip can further include a current blocking layer and a current spreading layer. The current blocking layer is disposed on a portion of the first top surface of the second-type doped semiconductor layer, while the current spreading layer is disposed on the second-type doped semiconductor layer for covering the current blocking layer.

In an embodiment of the present invention, when the LED chip further includes the current blocking layer and the current spreading layer, the wall structure includes a semiconductor epitaxial layer and a cap layer. The semiconductor epitaxial layer has a third top surface substantially aligned to the first top surface of the second-type doped semiconductor layer. The cap layer at least covers a portion of the third top surface of the semiconductor epitaxial layer. In a preferred embodiment of the present invention, the cap layer is, for example, a dielectric layer, and a material of the dielectric layer is substantially the same as a material of the current blocking layer.

In an embodiment of the present invention, the cap layer includes a dielectric layer and a conductive layer disposed on the dielectric layer. Here, a material of the dielectric layer is substantially the same as a material of the current blocking layer, and a material of the conductive layer is substantially the same as a material of the current spreading layer or a material of the electrodes.

In an embodiment of the present invention, the cap layer includes a dielectric layer, a first conductive layer disposed on the dielectric layer, and a second conductive layer disposed on the first conductive layer. Here, a material of the dielectric layer is substantially the same as a material of the current blocking layer, a material of the first conductive layer is substantially the same as a material of the current spreading layer, and a material of the second conductive layer is substantially the same as a material of the electrodes.

In an embodiment of the present invention, the electrodes include a first electrode and a second electrode. The first electrode is disposed on the first-type doped semiconductor layer that is not covered by the active layer, such that the first electrode is electrically connected with the first-type doped semiconductor layer. The second electrode is disposed on and electrically connected with the second-type doped semiconductor layer.

The present invention further provides a fabricating method of an LED chip. First of all, a first-type doped semiconductor material layer, a light emitting material layer, and a second-type doped semiconductor material layer are sequentially formed on a substrate. Next, the second-type doped semiconductor material layer, the light emitting material layer, and the first-type doped semiconductor material layer are patterned, so as to form a first-type doped semiconductor layer, an active layer, and a second-type doped semiconductor layer. The active layer is disposed on a portion of the first-type doped semiconductor layer. The second-type doped semiconductor layer is disposed on the active layer and has a first top surface. Thereafter, a plurality of electrodes are formed on the first-type doped semiconductor layer and the second-type doped semiconductor layer. In addition, a wall structure is formed on the first-type doped semiconductor layer that is not covered by the active layer according to the present invention. The wall structure surrounds the active layer and has a second top surface higher than the first top surface of the second-type doped semiconductor layer. In the present invention, a method for forming the wall structure and an order of forming the same are not limited.

In an embodiment of the present invention, a method for forming the wall structure includes forming a semiconductor epitaxial layer on the first-type doped semiconductor layer at first, for example. The semiconductor epitaxial layer has a third top surface substantially aligned to the first top surface of the second-type doped semiconductor layer. Next, a cap layer is formed for at least covering a portion of the third top surface of the semiconductor epitaxial layer.

In an embodiment of the present invention, the cap layer and the electrodes are fabricated together.

In an embodiment of the present invention, the semiconductor epitaxial layer is fabricated together with the first-type doped semiconductor layer, the active layer, and the second-type doped semiconductor layer.

In an embodiment of the present invention, the fabricating method of the LED chip can further include forming a current blocking layer on a portion of the first top surface of the second-type doped semiconductor layer and forming a current spreading layer on the second-type doped semiconductor layer for covering the current blocking layer. In a preferred embodiment of the present invention, the method for forming the wall structure includes forming a semiconductor epitaxial layer on the first-type doped semiconductor layer at first, for example. The semiconductor epitaxial layer has a third top surface substantially aligned to the first top surface of the second-type doped semiconductor layer. Next, a cap layer is formed for at least covering a portion of the third top surface of the semiconductor epitaxial layer.

In an embodiment of the present invention, the cap layer includes a dielectric layer fabricated together with the current blocking layer. In a preferred embodiment of the present invention, the cap layer includes a dielectric layer and a conductive layer disposed on the dielectric layer. The dielectric layer and the current blocking layer are fabricated together, and the conductive layer and the current spreading layer are fabricated together. Certainly, the conductive layer can also be fabricated together with the electrodes.

In an embodiment of the present invention, the cap layer includes a dielectric layer, a first conductive layer disposed on the dielectric layer, and a second conductive layer disposed on the first conductive layer. The dielectric layer and the current blocking layer are fabricated together, the first conductive layer and the current spreading layer are fabricated together, and the second conductive layer and the electrodes are fabricated together.

The present invention provides another LED chip including a substrate, a semiconductor device layer, a wall structure in a form of a continuous pattern, and a plurality of electrodes. The semiconductor device layer is disposed on the substrate, and the wall structure in the form of the continuous pattern is disposed on the semiconductor device layer. The electrodes are disposed on and electrically connected with the semiconductor device layer. Here, a material of the wall structure is substantially the same as a material of the electrodes.

The present invention provides still another LED chip including a substrate, a semiconductor device layer, a current blocking layer, a current spreading layer, a wall structure in a form of a continuous pattern, and a plurality of electrodes. The semiconductor device layer is disposed on the substrate. The current blocking layer is disposed on the semiconductor device layer. The current spreading layer is disposed on the semiconductor device layer for covering the current blocking layer. The wall structure in the form of the continuous pattern is disposed on the semiconductor device layer. Besides, the wall structure includes a bottom layer and a top layer disposed on the bottom layer. A material of the bottom layer is substantially the same as a material of the current blocking layer, and a material of the top layer is substantially the same as a material of the current spreading layer. Additionally, the electrodes are disposed on and electrically connected with the semiconductor device layer.

In the present invention, the wall structure is formed during the fabrication of the LED. Hence, the light emitting efficiency of the LED chip in the present invention can be enhanced in an effective manner.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
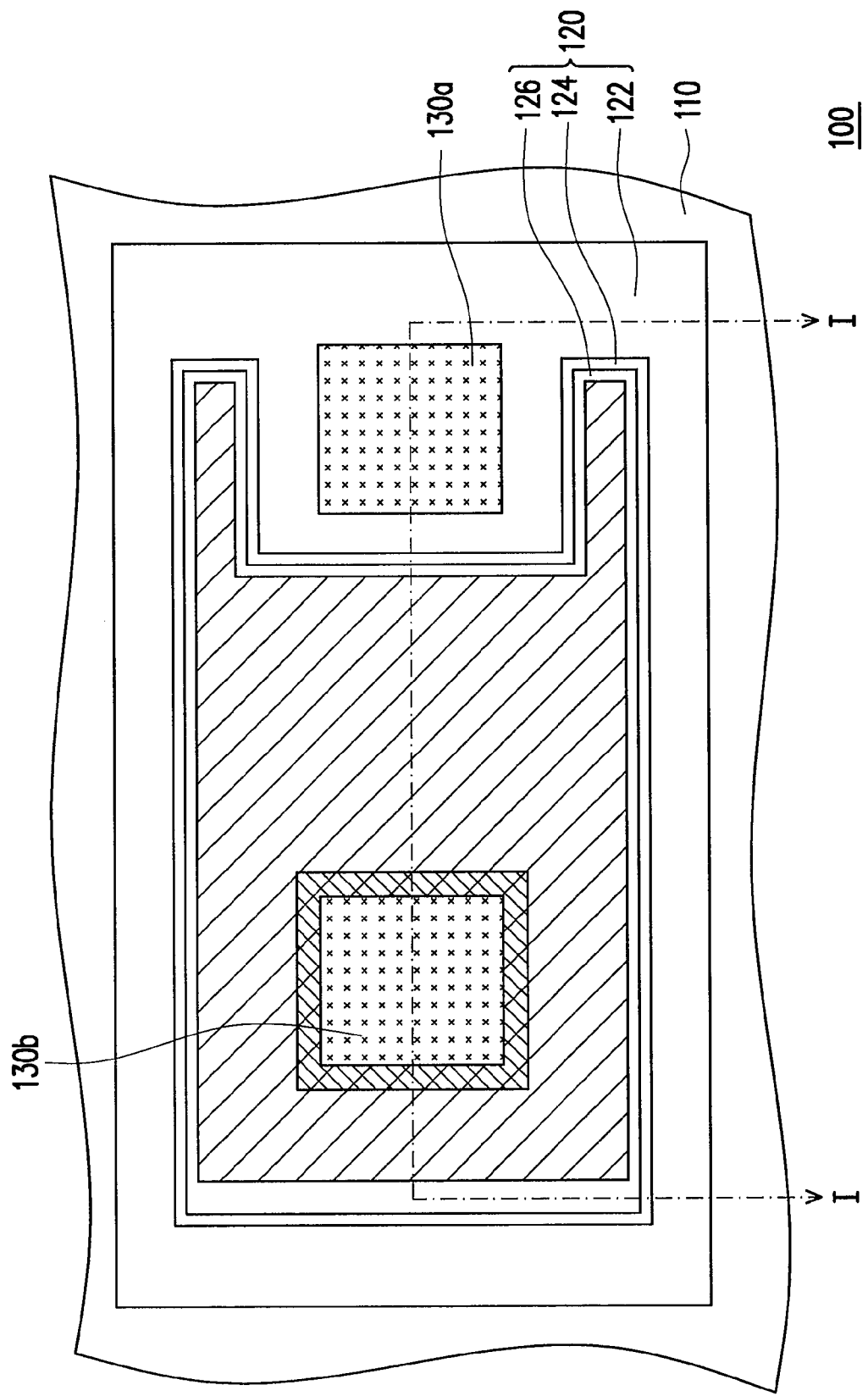
FIG. 1A is a top view of a conventional LED chip.
Figure 1B:
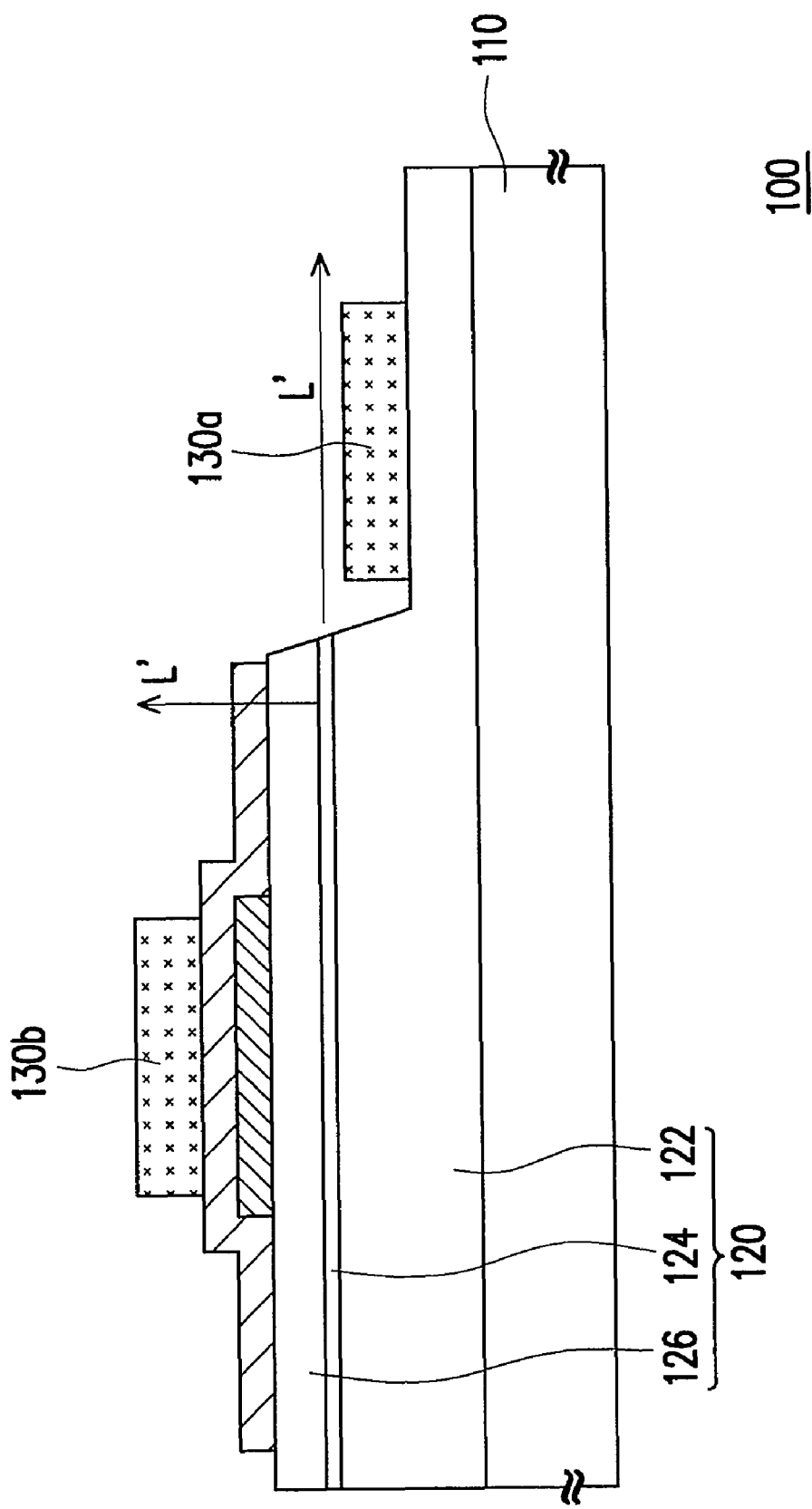
FIG. 1B is a schematic cross-sectional view taken along a sectional line I-I depicted in FIG. 1A.
Figure 2A:
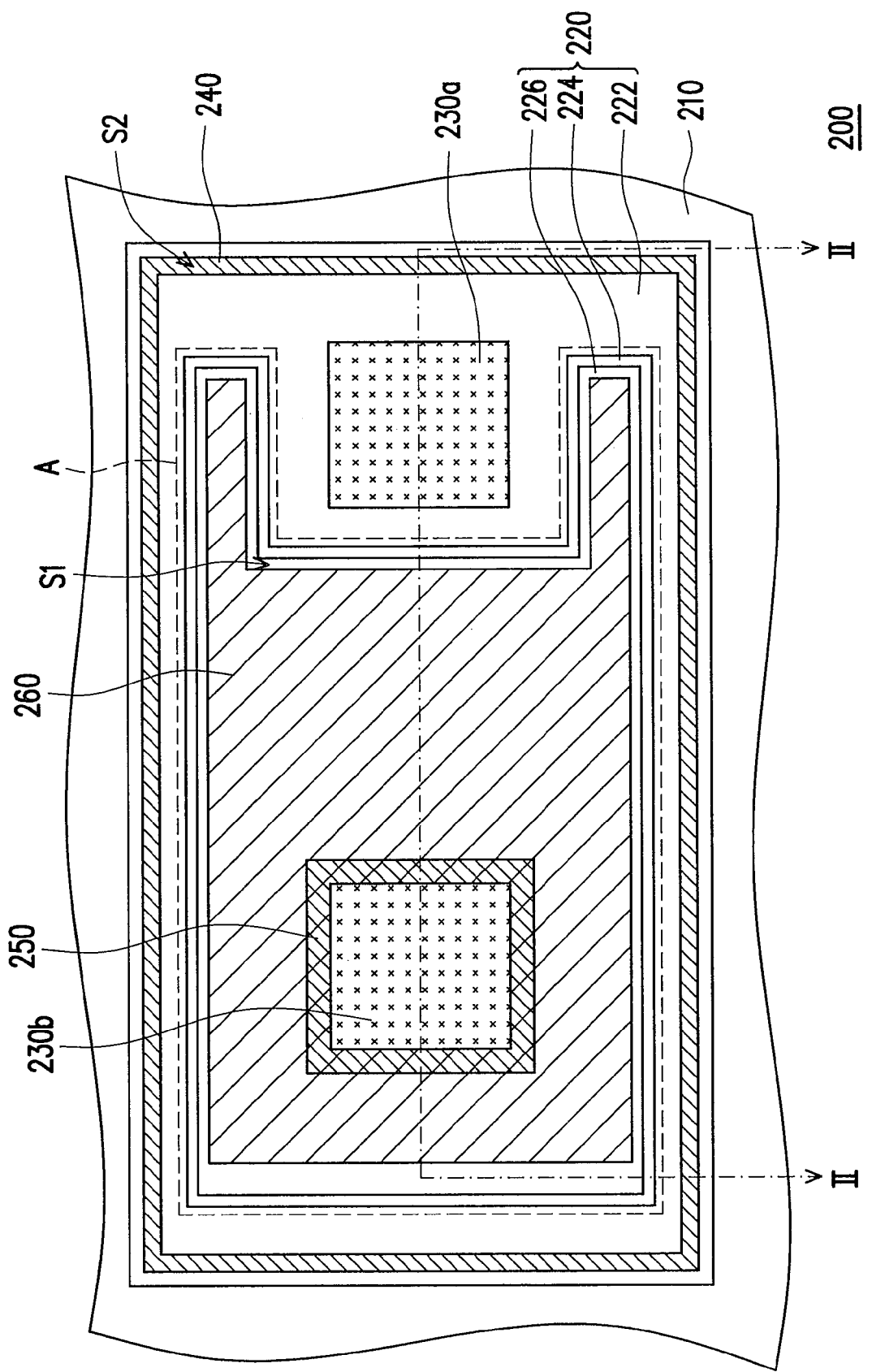
FIG. 2A is a top view of an LED chip according to a first embodiment of the present invention.
Figure 2B:
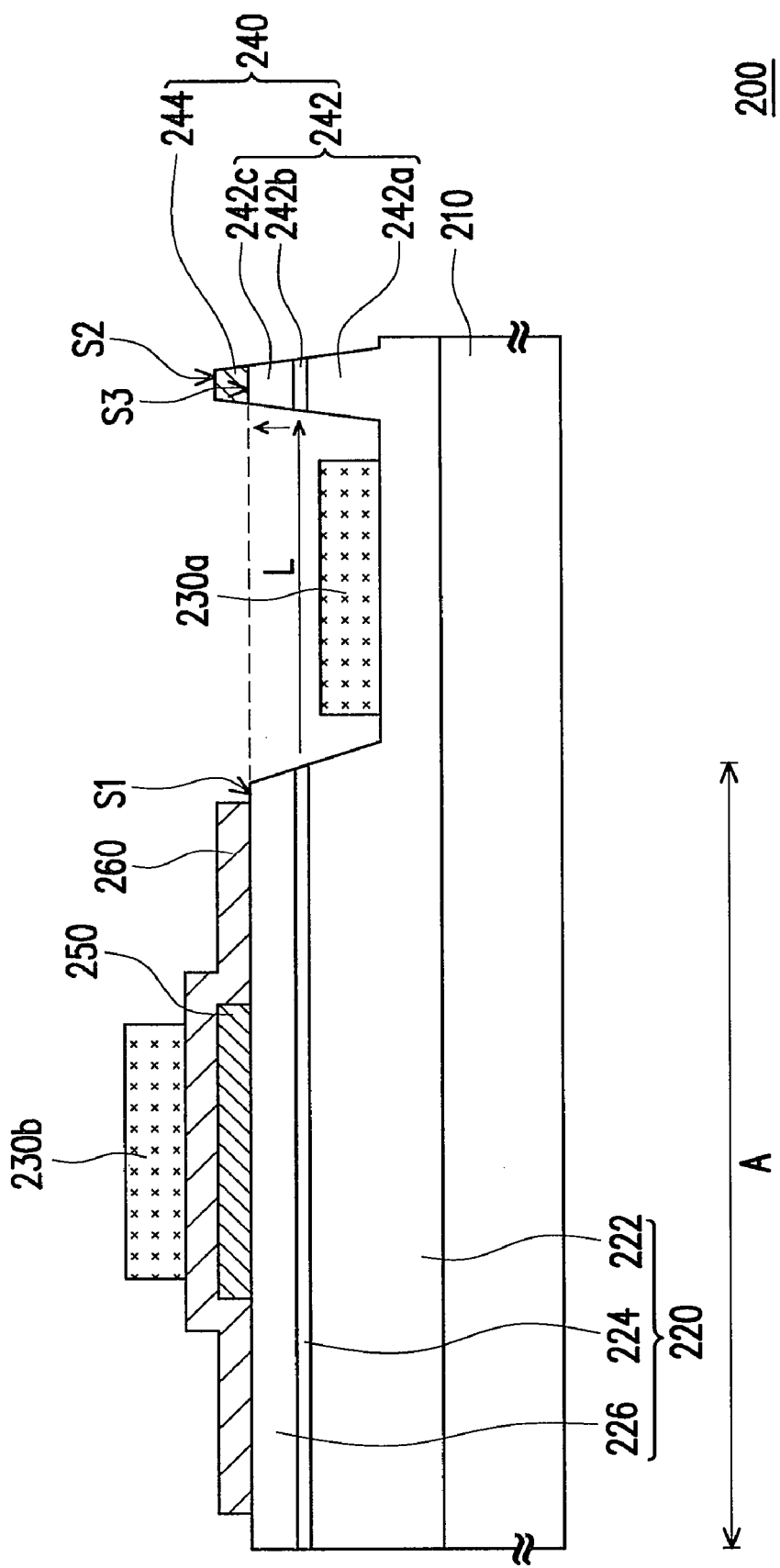
FIG. 2B is a schematic cross-sectional view taken along a sectional line II-II depicted in FIG. 2A.

FIG. 2A is a top view of an LED chip according to a first embodiment of the present invention, and FIG. 2B is a schematic cross-sectional view taken along a section line II-II depicted in FIG. 2A. Referring to FIGS. 2A and 2B, an LED chip 200 in the present embodiment includes a substrate 210, a semiconductor device layer 220, a wall structure 240, and a plurality of electrodes 230a and 230b. The semiconductor device layer 220 is disposed on the substrate 210 and includes a first-type doped semiconductor layer 222, an active layer 224, and a second-type doped semiconductor layer 226. The first-type doped semiconductor layer 222 is disposed on the substrate 210. The active layer 224 is disposed on a portion A of the first-type doped semiconductor layer 222. The second-type doped semiconductor layer 226 is disposed on the active layer 224 and has a first top surface S1. The wall structure 240 is disposed on the first-type doped semiconductor layer 222 that is not covered by the active layer 224. Besides, the wall structure 240 surrounds the active layer 224 and has a second top surface S2 higher than the first top surface S1 of the second-type doped semiconductor layer 226.

The electrodes 230a and 230b are respectively disposed on and electrically connected with the first-type doped semiconductor layer 222 and the second-type doped semiconductor layer 226. In detail, the electrode 230a is disposed on the first-type doped semiconductor layer 222 that is not covered by the active layer 224, so as to be electrically connected with the first-type doped semiconductor layer 222 and form a favorable ohmic contact with the first-type doped semiconductor layer 222. The electrode 230b is disposed on and electrically connected with the second-type doped semiconductor layer 226. Moreover, a favorable ohmic contact is formed between the electrode 230b and the second-type doped semiconductor layer 226.

In most cases, the substrate 210 is made of materials characterized by high transmittance and satisfactory heat dissipation capacity. In the present embodiment, the substrate 210 can be an aluminum oxide substrate or any other substrate suitable for performing an epitaxy process. As shown in FIG. 2B, in the present embodiment, the first-type doped semiconductor layer 222 is an N-type semiconductor layer, the active layer 224 is an multiple quantum well (MQW) active layer, and the second-type doped semiconductor layer 226 is a P-type semiconductor layer. It is of certain that the first-type doped semiconductor layer 222 can also be a P-type semiconductor layer, while the second-type doped semiconductor layer 226 can be an N-type semiconductor layer.

Referring to FIGS. 2A and 2B, to effectively make use of light L propagated laterally by the active layer 224, the wall structure 240 of the present embodiment can be in a form of a continuous pattern for reflecting the light L upwardly. That is to say, the structural design of the wall structure 240 can efficaciously give rise to an alteration in a transmitting direction of the light L.

When the wall structure 240 with a relatively great height is intended to be formed, i.e., when the wall structure 240 having the second top surface S2 higher than the first top surface S1 of the second-type doped semiconductor layer 226 is to be formed, the fabrication of the wall structure 240 can be accomplished by stacking thin films according to the present embodiment. The thin films are used to form the LED chip 200. For instance, the thin films can be referred to as a semiconductor layer utilized for forming the semiconductor device layer 220, a dielectric layer utilized for forming a current blocking layer, or a conductive layer utilized for forming a current spreading layer and the electrodes 230a and 230b.

Specifically, the wall structure 240 includes a semiconductor epitaxial layer 242 and a cap layer 244. The semiconductor epitaxial layer 242 has a third top surface S3 substantially aligned to the first top surface S1 of the second-type doped semiconductor layer 226. In the present embodiment, the cap layer 244 merely covers the third top surface S3 of the semiconductor epitaxial layer 242. Nevertheless, in other embodiments, the cap layer 244 can cover only one portion of the third top surface S3 and expose the other portions of the third top surface S3. In an alternative, the cap layer 244 can cover the third top surface S3 and side wall(s) of the semiconductor epitaxial layer 242 at the same time. Namely, the cap layer 244 can be extended to the side wall(s) of the semiconductor epitaxial layer 242 from the third top surface S3.

According to the present embodiment, the thin films in the semiconductor epitaxial layer 242 and the thin films in the semiconductor device layer 220 are stacked in substantially the same manner. Particularly, a material of a semiconductor epitaxial layer 242a is substantially the same as a material of the first-type doped semiconductor layer 222, a material of a semiconductor epitaxial layer 242b is substantially the same as a material of the active layer 224, and a material of a semiconductor epitaxial layer 242c is substantially the same as a material of the second-type doped semiconductor layer 226. In other words, the semiconductor epitaxial layer 242, the first-type doped semiconductor layer 222, the active layer 224, and the second-type doped semiconductor layer 226 can be fabricated in the same manufacturing step.

According to the present embodiment, the cap layer 244 can be a dielectric layer or a conductive layer, and materials of the cap layer 244 are elaborated hereinafter.

To improve the light emitting efficiency of the semiconductor device layer 220, the LED chip 200 can further include a current blocking layer 250 and a current spreading layer 260. Here, the current blocking layer 250 and the current spreading layer 260 are respectively made of a dielectric material and a conductive material. As indicated in FIG. 2B, the current blocking layer 250 corresponding to the electrode 230b is disposed on a portion of the first top surface S1 of the second-type doped semiconductor layer 226. Besides, the current spreading layer 260 corresponding to the active layer 224 is disposed on the second-type doped semiconductor layer 226 and covers the current blocking layer 250.

In FIG. 2B, when the LED chip 200 further includes the current blocking layer 250 and the current spreading layer 260, the cap layer 244 can be a dielectric layer whose material is substantially the same as a material of the current blocking layer 250. That is to say, the cap layer 244 and the current blocking layer 250 that are both made of the dielectric material can be fabricated in the same step. Likewise, the cap layer 244 can also be the conductive layer whose material is substantially the same as a material of the current spreading layer 260. As such, the cap layer 244 and the current spreading layer 260 that are made of the conductive material can be fabricated in the same step. Moreover, the cap layer 244 can also be made of the same conductive material as are the electrodes 230a and 230b. Thus, the cap layer 244 and the electrodes 230a and 230b that are all made of the conductive material can be fabricated in the same step.

Figure 2C:
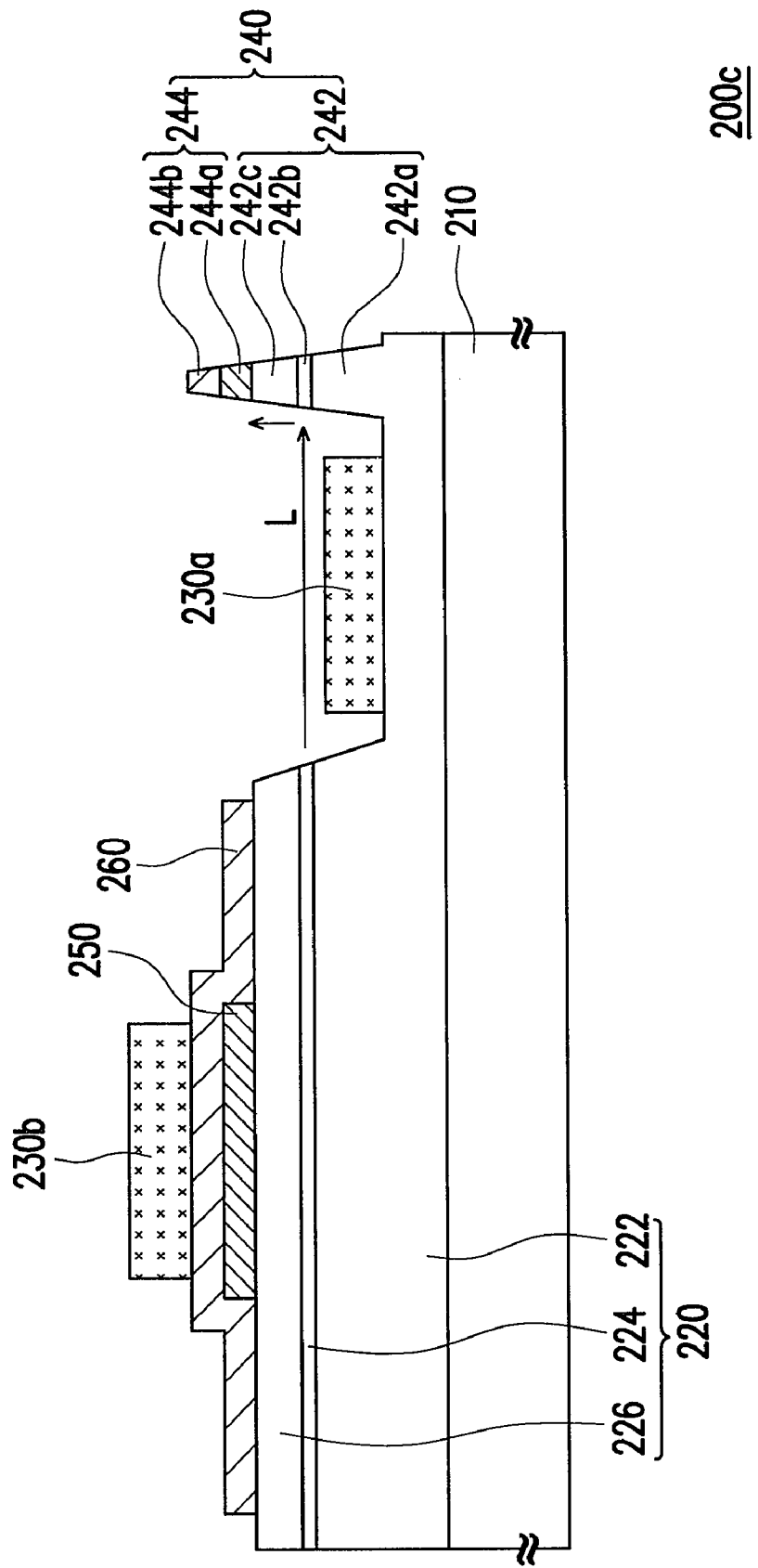
FIGS. 2C through 2F are schematic cross-sectional views of the LED chip having four types of cap layers according to the first embodiment of the present invention.

In other embodiments, the cap layer 244 can be any combination of the dielectric layer and the conductive layer discussed above, which is exemplified in FIGS. 2C through 2F and described hereinafter. In FIG. 2C, the cap layer 244 in an LED chip 200c includes a dielectric layer 244a and a conductive layer 244b disposed on the dielectric layer 244a. Here, a material of the dielectric layer 244a is substantially the same as the material of the current blocking layer 250, and a material of the conductive layer 244b is substantially the same as the material of the current spreading layer 260. The dielectric layer 244a of the cap layer 244 and the current blocking layer 250 can be fabricated in the same step, and the conductive layer 244b of the cap layer 244 and the current spreading layer 260 can be fabricated in the same step. On the other hand, as respectively shown in FIGS. 2D and 2E, the conductive layer 244b of the cap layer 244 in LED chips 200d and 200e is made of substantially the same material as are the electrodes 230a and 230b. Thereby, the conductive layer 244b of the cap layer 244 and the electrodes 230a and 230b can all be fabricated in the same step.

Figure 2D:
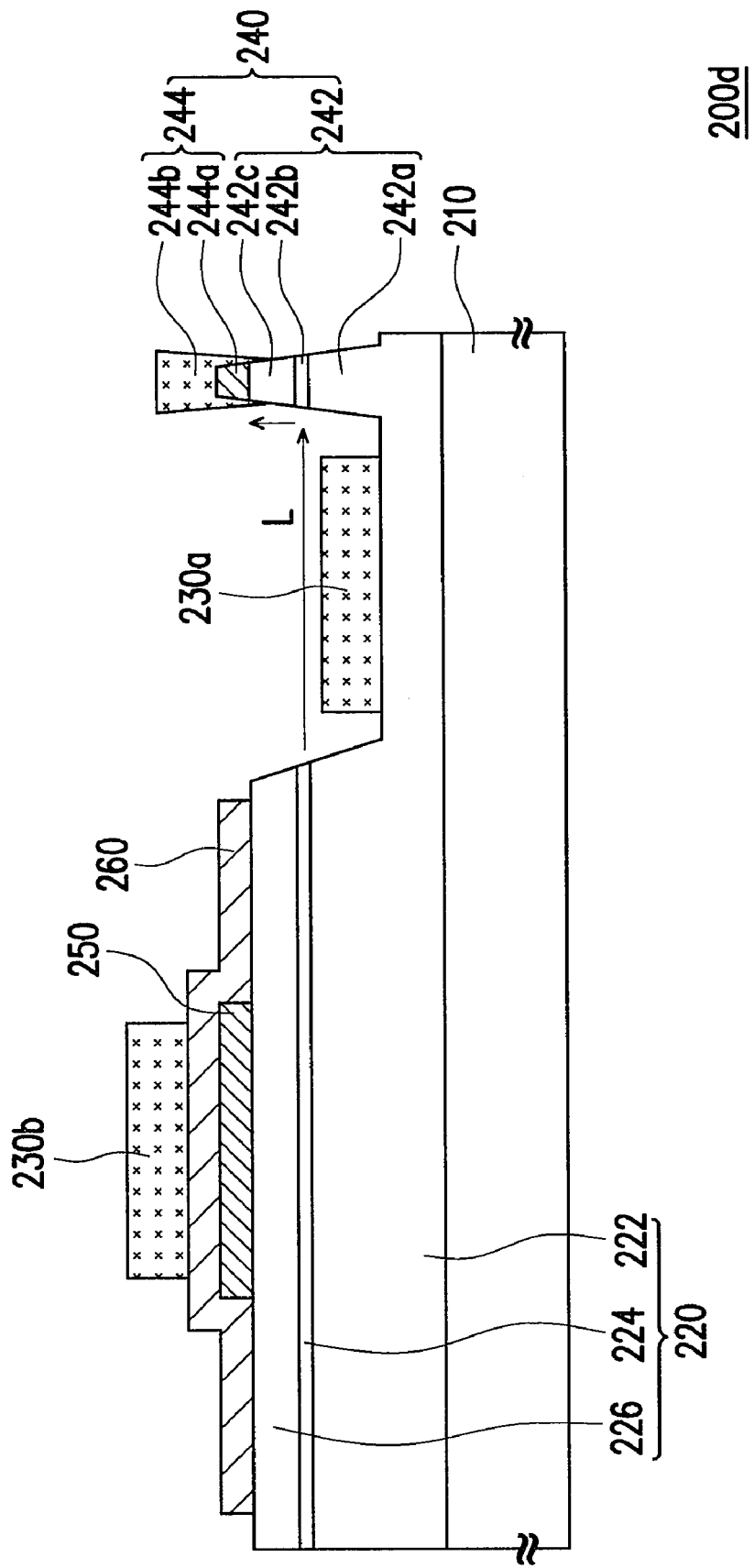
Figure 2E:
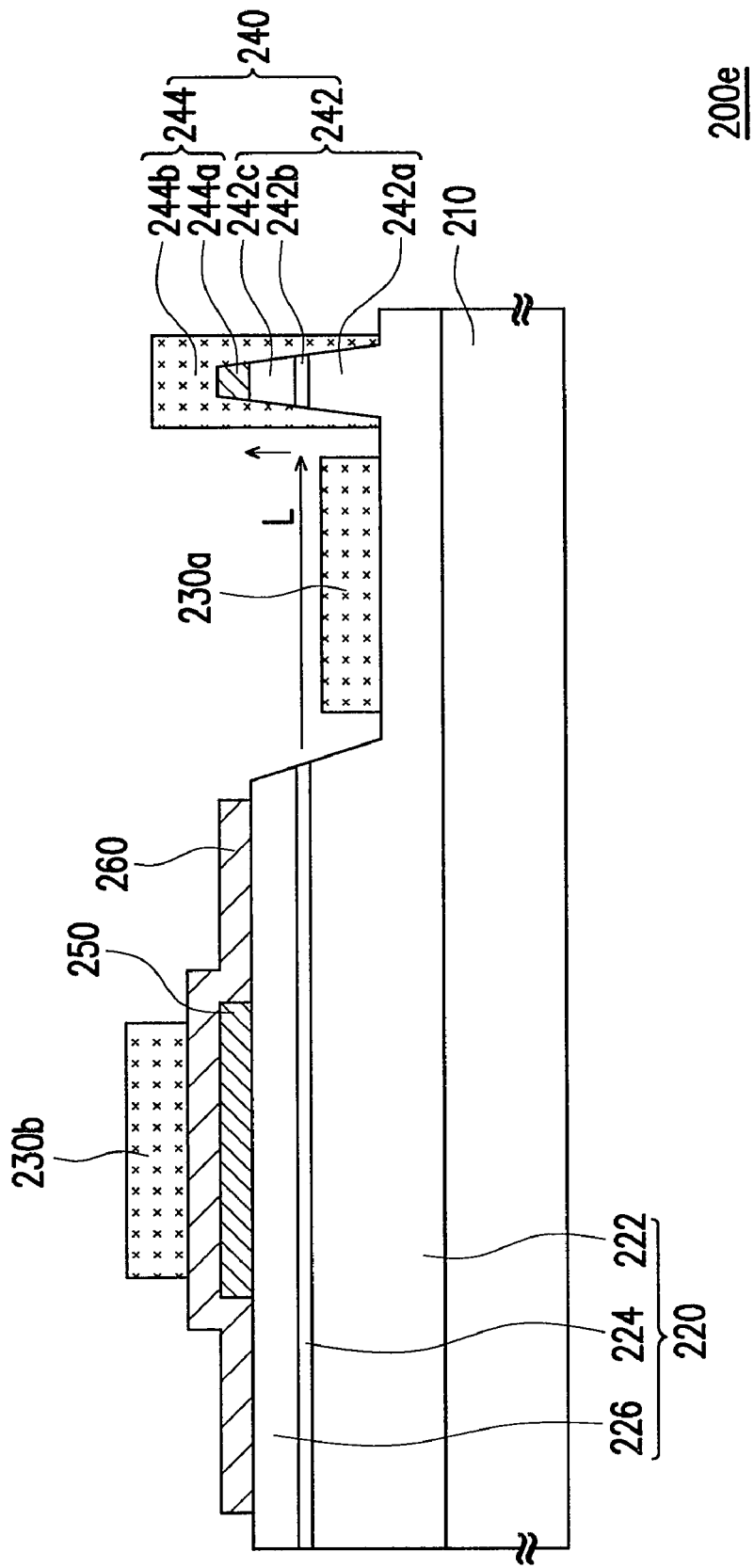

Note that the cap layer 244 of the LED chip 200c in FIG. 2C merely covers the third top surface S3 of the semiconductor epitaxial layer 242, while the cap layer 244 of the LED chips 200d and 200e respectively shown in FIGS. 2D and 2E covers the third top surface S3 of the semiconductor epitaxial layer 242 and the side wall(s) thereof. Here, the cap layer 244 of the LED chip 200d covers a portion of the side wall(s) of the semiconductor epitaxial layer 242, while the cap layer 244 of the LED chip 200e covers the entire semiconductor epitaxial layer 242. Apparently, the wall structure 240 respectively depicted in FIGS. 2C, 2D, and 2E allows the light L laterally propagated to be propagated upwardly. Thereby, the laterally-propagated light L can be effectively utilized.

Figure 2F:
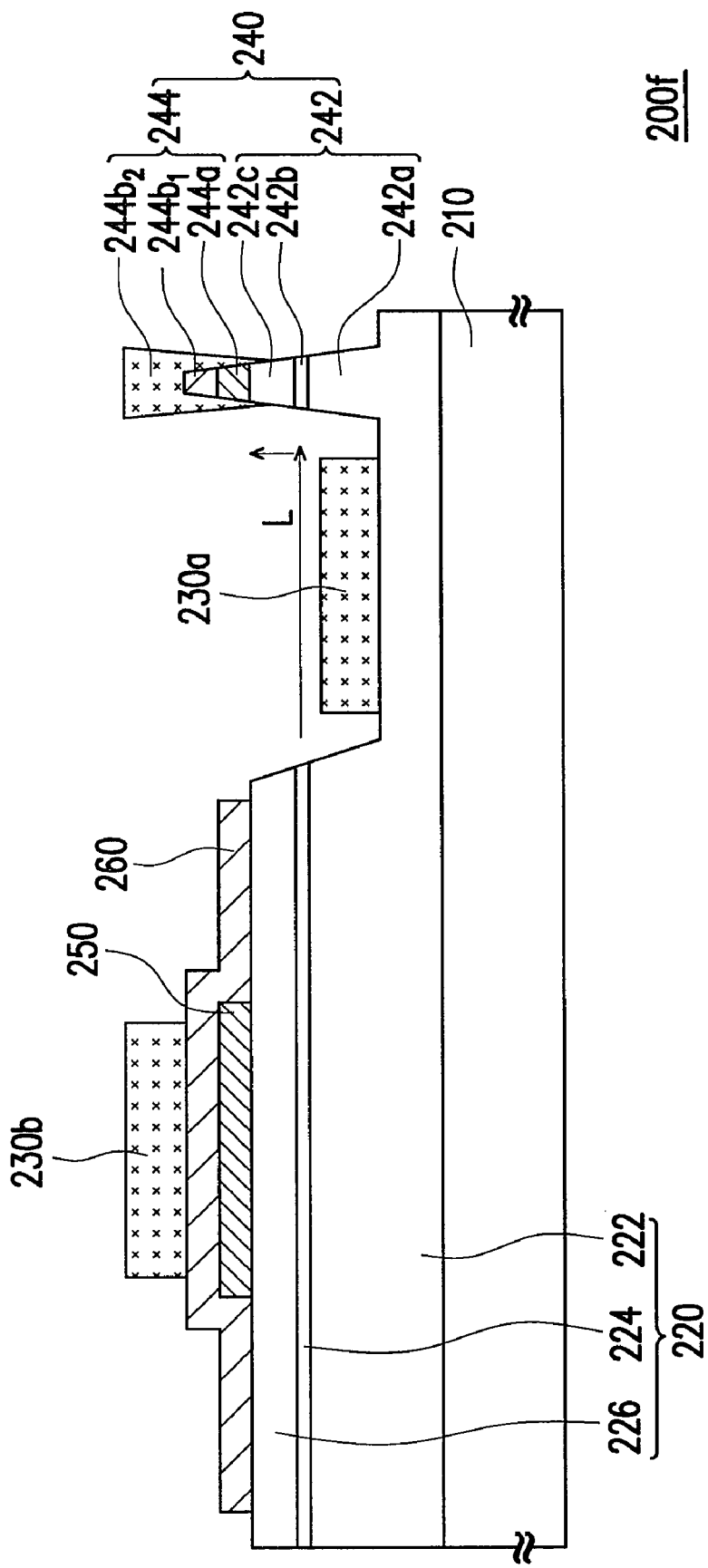

With reference to FIG. 2F, the cap layer 244 in an LED chip 200f includes a dielectric layer 244a, a first conductive layer $244b_1$ disposed on the dielectric layer 244a, and a second conductive layer $244b_2$ disposed on the first conductive layer $244b_1$. Here, a material of the dielectric layer 244a is substantially the same as the material of the current blocking layer 250, a material of the first conductive layer $244b_1$ is substantially the same as the material of the current spreading layer 260, and a material of the second conductive layer $244b_2$ is substantially the same as the material of the electrodes 230a and 230b.

It can be observed from FIGS. 2B through 2F that the wall structure 240 in the LED chip can be formed by stacking the thin films. Nonetheless, the wall structure 240 of the LED chip as described above merely serves to exemplify the present invention. The structures and the fabrication of the wall structure 240 should not be construed as limited to the aforesaid structures and methods for stacking the thin films in the LED chip of the present invention. Any possible structures of and methods for stacking the thin films should be included in the scope of the present invention. A fabricating method of the aforesaid LED chip is elaborated hereinafter.

Figure 3A:
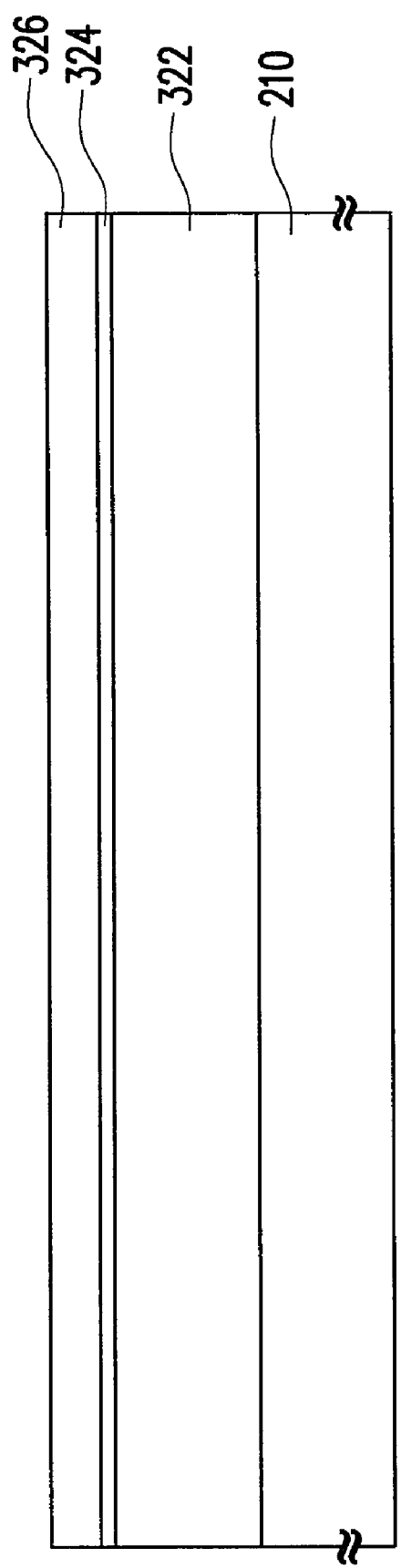
FIGS. 3A through 3C are cross-sectional flowcharts illustrating a process of manufacturing the LED chip according to the first embodiment of the present invention.
Figure 3B:
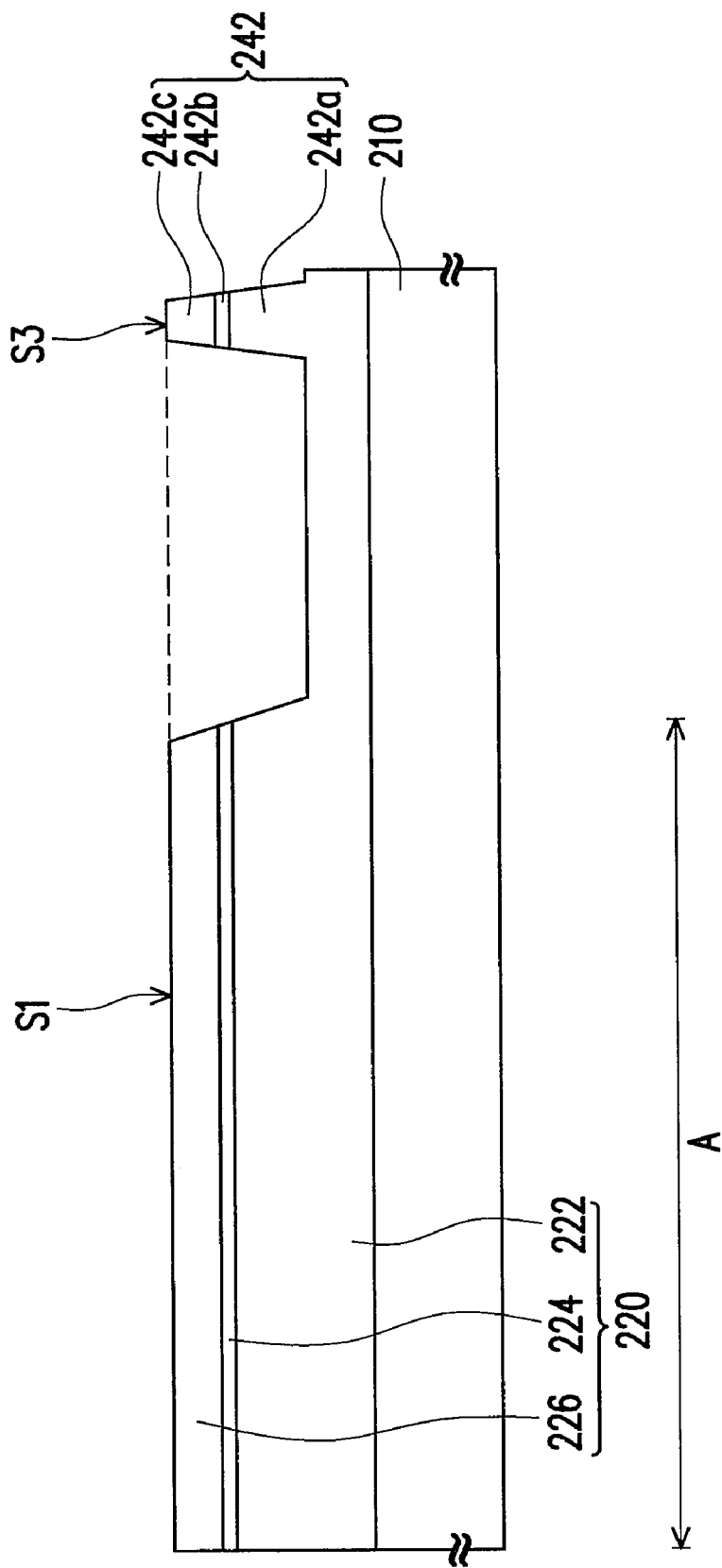
Figure 3C:
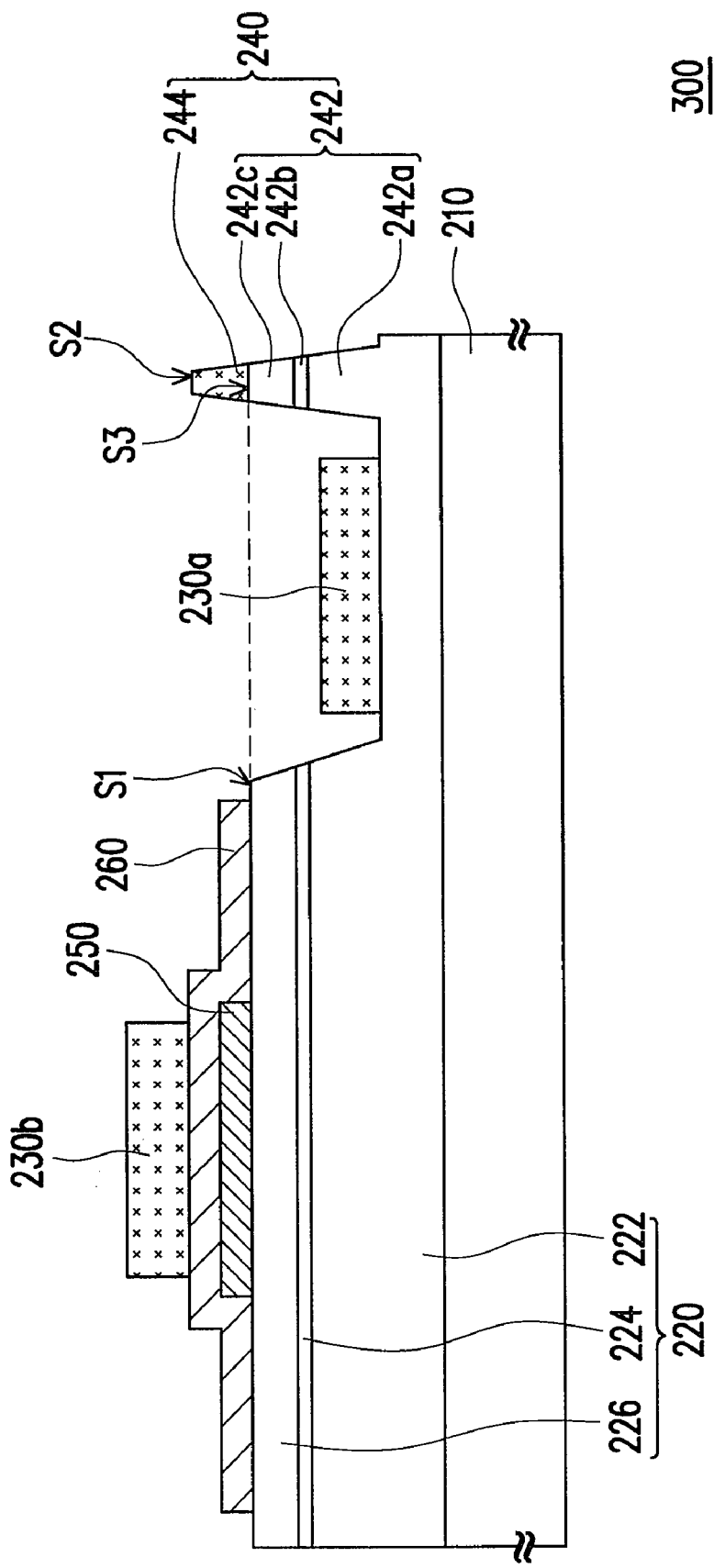

FIGS. 3A through 3C are cross-sectional flowcharts illustrating a process of manufacturing the LED chip according to the first embodiment of the present invention. Referring to FIG. 3A, first of all, a first-type doped semiconductor material layer 322, a light emitting material layer 324, and a second-type doped semiconductor material layer 326 are sequentially formed on the substrate 210. In the present embodiment, the substrate 210 is, for example, made of aluminum oxide characterized by satisfactory transmittance. Besides, the first-type doped semiconductor material layer 322 is, for example, made of an N-type semiconductor material. The light emitting material layer 324 is, for example, made of an MQW light emitting material. The second-type doped semiconductor material layer 326 is, for example, made of a P-type semiconductor material. However, the first-type doped semiconductor material layer 322 and the second-type doped semiconductor material layer 326 can also be made of the P-type semiconductor material and the N-type semiconductor material, respectively.

Referring to FIG. 3B, the second-type doped semiconductor material layer 326, the light emitting material layer 324, and the first-type doped semiconductor material layer 322 are patterned to form the second-type doped semiconductor layer 226, the active layer 224, and the first-type doped semiconductor layer 222. Here, the first-type doped semiconductor layer 222, the active layer 224, and the second-type doped semiconductor layer 226 together form the semiconductor device layer 220. As indicated in FIG. 3B, in the semiconductor device layer 220, the active layer 224 is disposed on a portion A of the first-type doped semiconductor layer 222. The second-type doped semiconductor layer 226 is disposed on the active layer 224 and has the first top surface S1.

After that, referring to FIG. 3C, the electrodes 230a and 230b are formed on the first-type doped semiconductor layer 222 and the second-type doped semiconductor layer 226. Here, the electrode 230a is disposed on the first-type doped semiconductor layer 222, while the electrode 230b is disposed on the second-type doped semiconductor layer 226. However, to enhance the light emitting efficiency of the semiconductor device layer 220, the current blocking layer 250 can be selectively formed on a portion of the first top surface S1 of the second-type doped semiconductor layer 226 prior to the formation of the electrodes 230a and 230b according to the present invention. Meanwhile, the current spreading layer 260 can be selectively formed on the second-type doped semiconductor layer 226 for covering the current blocking layer 250.

As shown in FIGS. 3B and 3C, the method for forming the wall structure 240 includes forming the semiconductor epitaxial layer 242 on the first-type doped semiconductor layer 222 at first, for example. The semiconductor epitaxial layer 242 has the third top surface S3 substantially aligned to the first top surface S1 of the second-type doped semiconductor layer 226. Next, the cap layer 244 is formed for at least covering a portion of the third top surface S3 of the semiconductor epitaxial layer 242. In the present embodiment, the cap layer 244 merely covers the third top surface S3 of the semiconductor epitaxial layer 242, for example. Apparently, the wall structure 240 constituted by the semiconductor epitaxial layer 242 and the cap layer 244 has the second top surface S2 which is higher than the first top surface S1 of the second-type doped semiconductor layer 226.

In the present embodiment, the semiconductor epitaxial layer 242 and the semiconductor device layer 220 are fabricated together (as shown in FIG. 3B), and the cap layer 244 and the electrodes 230a and 230b are fabricated together (as shown in FIG. 3C). However, in the present invention, it is not limited that the wall structure 240 must be fabricated together with the semiconductor device layer 220 and the electrodes 230a and 230b. Namely, the cap layer 244 can be the dielectric layer that is fabricated together with the current blocking layer 250 (as shown in FIG. 2B). Moreover, the cap layer 244 can also have other configurations as depicted in FIGS. 2C through 2F.

From the fabricating method discussed above, it is known that the fabrication of the LED chips 200, 200c, 200d, 200e, and 200f in the present embodiment can be integrated into the existing manufacturing process, and therefore the present invention neither results in a significant increase in the manufacturing costs nor brings about a decrease in manufacturing yield.

Figure 4A:
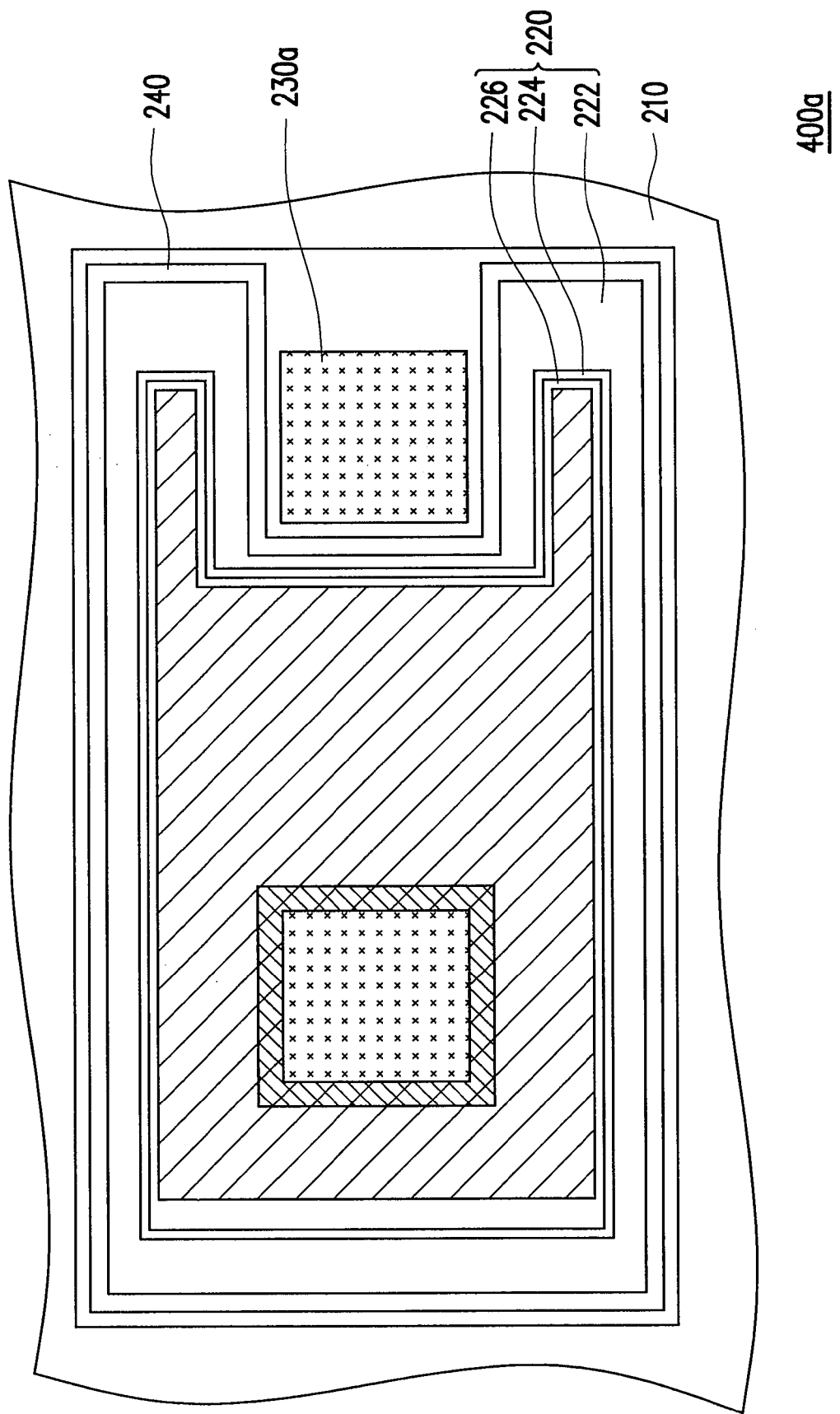
FIGS. 4A and 4B are schematic cross-sectional views of the LED chip in which a wall structure has two types of continuous patterns according to the first embodiment of the present invention.
Figure 4B:
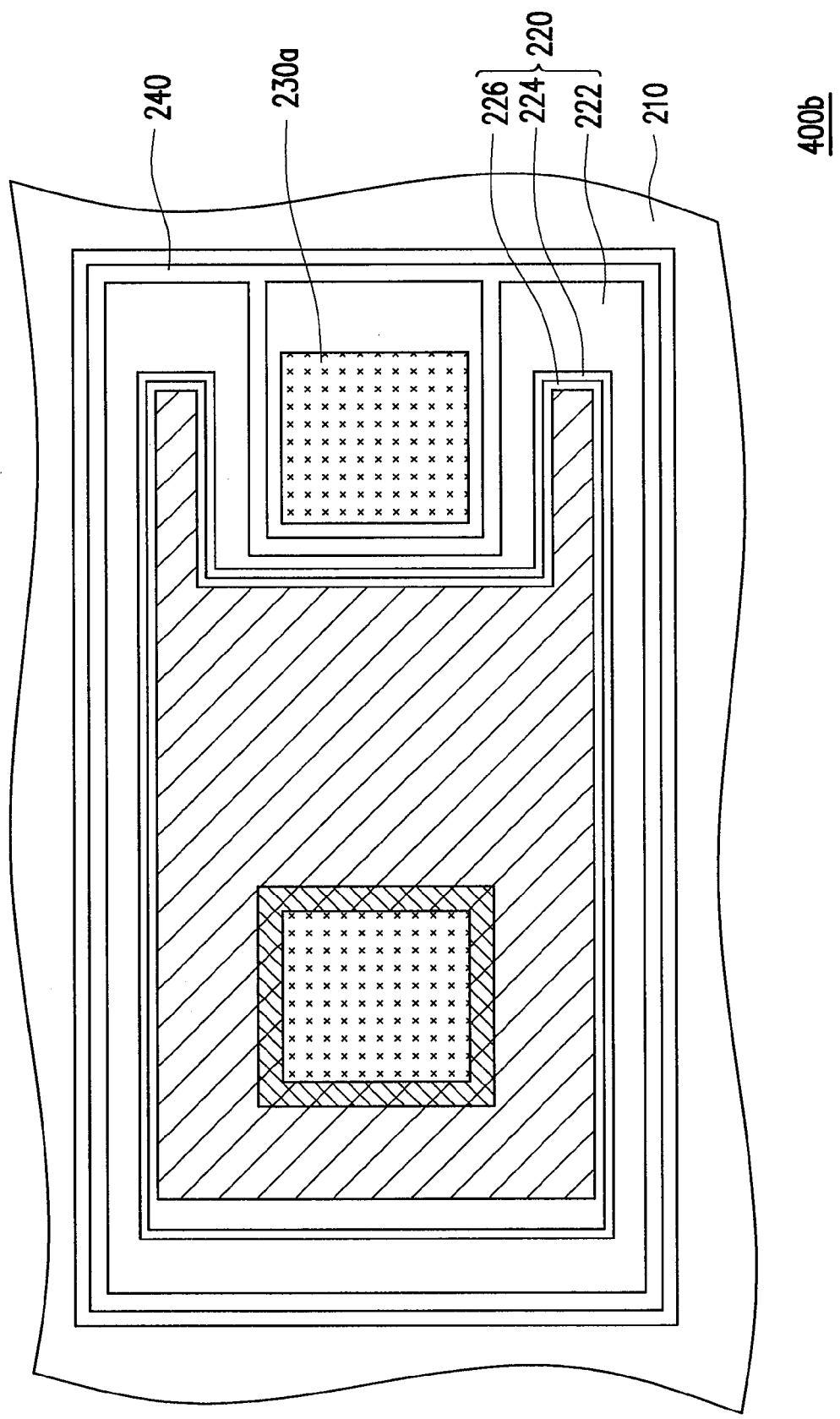

Moreover, said wall structure 240 is in the form of the continuous pattern that surrounds the active layer 224, for example. Thereby, the light emitted by the active layer 224 can be effectively utilized as shown in FIG. 2A. However, the wall structure 240 can have other types of continuous patterns. For instance, as shown in FIG. 4A, the wall structure 240 of an LED chip 400a is a pattern arranged along the active layer 224 and disposed between the active layer 224 and the electrode 230a. Alternatively, in an LED chip 400b as shown in FIG. 4B, the wall structure 240 is further arranged along the electrode 230a. It is for sure the form of the wall structure 240 is determined upon actual product demands, and the present invention does not restrict the wall structure 240 to be in a certain form as discussed above.

Second Embodiment

Figure 5A:
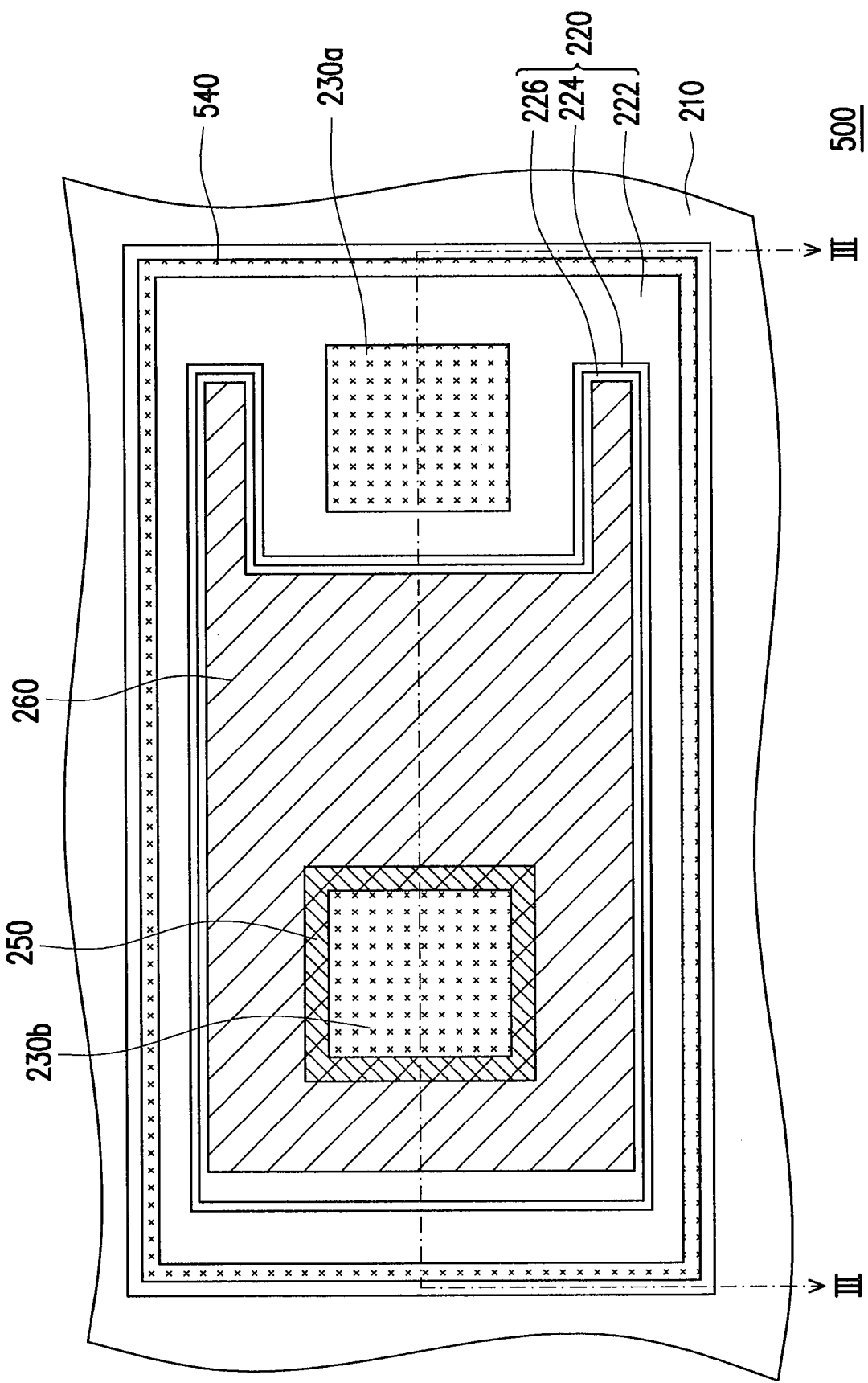
FIG. 5A is a top view of an LED chip according to a second embodiment of the present invention.
Figure 5B:
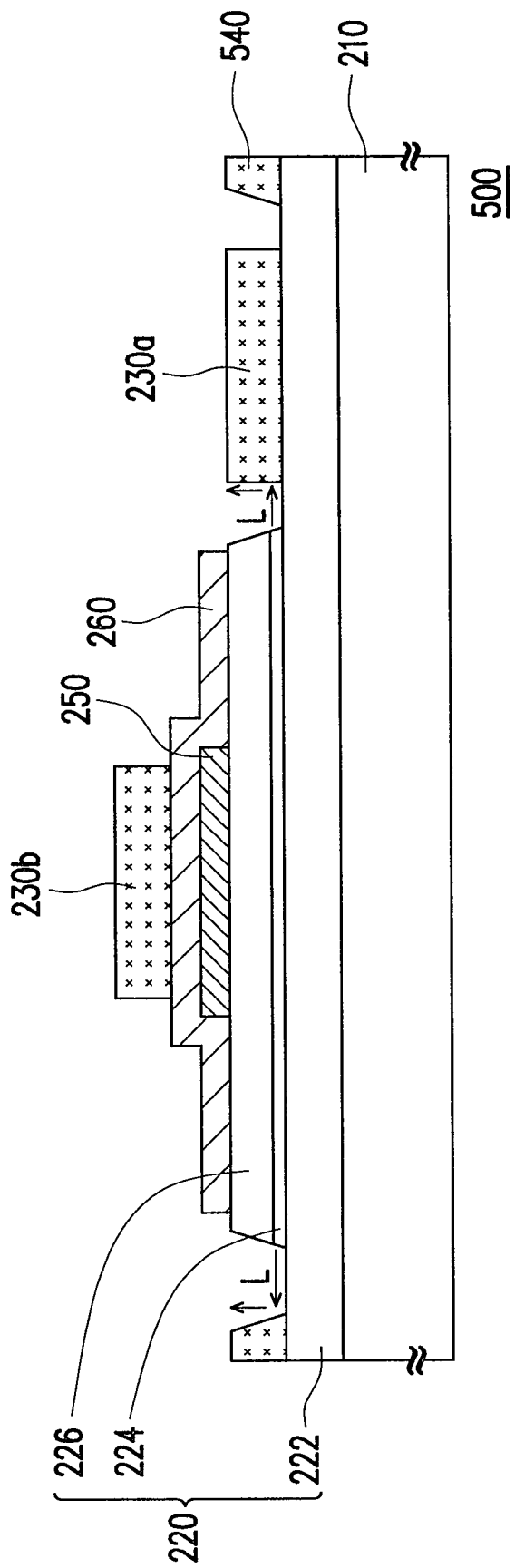
FIG. 5B is a schematic cross-sectional view taken along a sectional line III-III depicted in FIG. 5A.

FIG. 5A is a top view of an LED chip according to a second embodiment of the present invention, and FIG. 5B is a schematic cross-sectional view taken along a section line III-III depicted in FIG. 5A. Referring to FIGS. 5A and 5B, an LED chip 500 in the present embodiment includes a substrate 210, a semiconductor device layer 220, a plurality of electrodes 230a and 230b, and a wall structure 540 in a form of a continuous pattern. The semiconductor device layer 220 is disposed on the substrate 210, and the wall structure 540 in the form of the continuous pattern is disposed on the semiconductor device layer 220. The electrodes 230a and 230b are disposed on and electrically connected with the semiconductor device layer 220. As such, in the present embodiment, the design of the wall structure 540 allows the light L laterally propagated to be transmitted upwardly, which contributes to an improvement of the light emitting efficiency of the LED chip 500.

The structure of the LED chip 500 in the present embodiment is similar to that in the first embodiment, while the main difference therebetween lies in that the height of the wall structure 540 is not limited in the present embodiment. In addition, a material of the wall structure 540 and the material of the electrodes 230a and 230b are substantially the same. Accordingly, the wall structure 540 of the LED chip 500 can be fabricated together with the electrodes 230a and 230b according to the present embodiment.

Other components of the present embodiment can be referred to as those described in the first embodiment. The same or similar reference numbers used in the present embodiment and in the first embodiment represent the same or the like components, and therefore no further description is provided herein.

Third Embodiment

Figure 6:
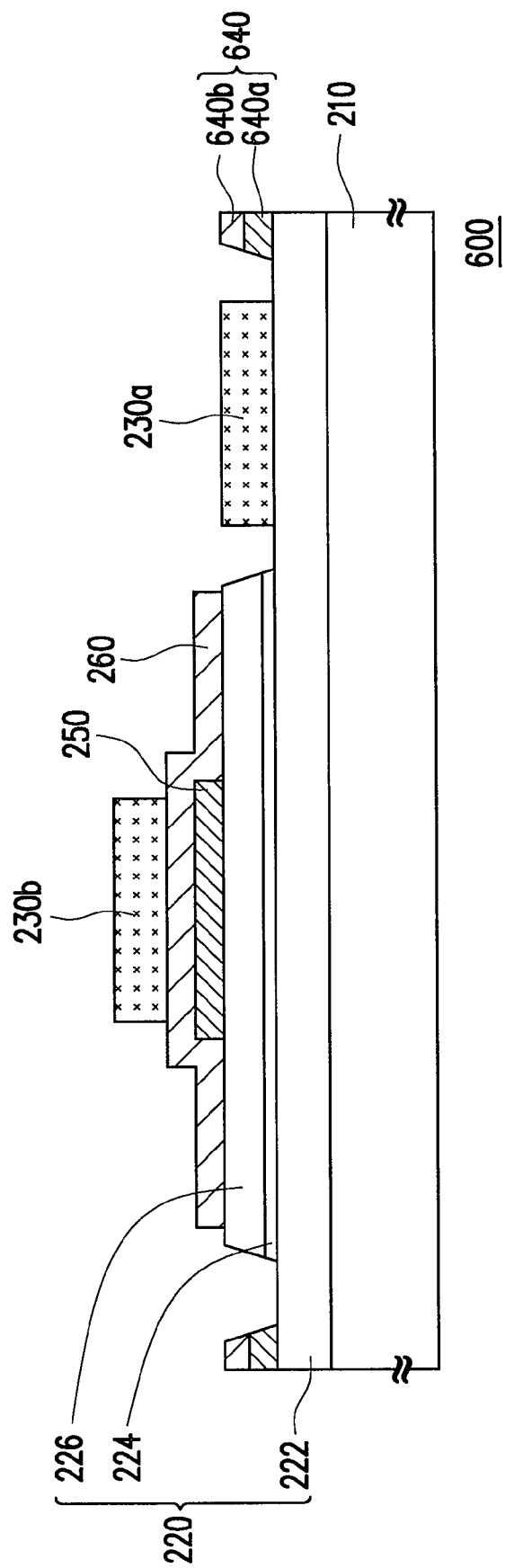
FIG. 6 is a schematic cross-sectional view of an LED chip according to a third embodiment of the present invention.

FIG. 6 is a schematic cross-sectional view of an LED chip according to a third embodiment of the present invention. Referring to FIG. 6, an LED chip 600 of the present embodiment includes a substrate 210, a semiconductor device layer 220, a current blocking layer 250, a current spreading layer 260, a wall structure 640 in a form of a continuous pattern, and a plurality of electrodes 230a and 230b. The semiconductor device layer 220 is disposed on the substrate 210. The current blocking layer 250 is disposed on the semiconductor device layer 220. The current spreading layer 260 is disposed on the semiconductor device layer 220 for covering the current blocking layer 250. The wall structure 640 in the form of the continuous pattern is disposed on the semiconductor device layer 220. The electrodes 230a and 230b are disposed on and electrically connected with the semiconductor device layer 220.

The LED chip 600 in the present embodiment is similar to the LED chip 500 in the second embodiment, while the main difference therebetween lies in that the wall structure 640 includes a bottom layer 640a and a top layer 640b disposed on the bottom layer 640a. A material of the bottom layer 640a is substantially the same as the material of the current blocking layer 250, while a material of the top layer 640b is substantially the same as the material of the current spreading layer 260. As such, the bottom layer 640a of the wall structure 640 in the present embodiment can be fabricated together with the current blocking layer 250, and the top layer 640b of the wall structure 640 can be fabricated together with the current spreading layer 260.

In light of the foregoing, the LED chip of the present invention has the wall structure to effectively utilize the light laterally propagated by the active layer. Thereby, the external quantum efficiency of the LED chip can be enhanced. Besides, the aforesaid LED chip with the satisfactory light emitting efficiency can be fabricated by means of the fabricating method of the LED chip as stated in the present invention. Since the fabrication of the LED chip in the present embodiment can be integrated into the existing manufacturing process, the present invention neither results in the significant increase in the manufacturing costs nor brings about the decrease in the manufacturing yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A light emitting diode chip, comprising:
a substrate;
a semiconductor device layer, disposed on the substrate and comprising:
   a first-type doped semiconductor layer, disposed on the substrate;
   an active layer, disposed on a portion of the first-type doped semiconductor layer;
   a second-type doped semiconductor layer, disposed on the active layer, wherein the second-type doped semiconductor layer has a first top surface;

a current blocking layer, disposed on a portion of the first top surface of the second-type doped semiconductor layer;

a current spreading layer, disposed on the second-type doped semiconductor layer covering the current blocking layer;

a wall structure, disposed on the first-type doped semiconductor layer that is not covered by the active layer, wherein the wall structure surrounds the active layer and has a second top surface higher than the first top surface of the second-type doped semiconductor layer; and a plurality of electrodes, disposed on and electrically connected with the first-type doped semiconductor layer and the second-type doped semiconductor layer.

2. The light emitting diode chip as claimed in claim 1, wherein the substrate comprises an aluminum oxide substrate.

3. The light emitting diode chip as claimed in claim 1, wherein the first-type doped semiconductor layer is an N-type semiconductor layer, while the second-type doped semiconductor layer is a P-type semiconductor layer.

4. The light emitting diode chip as claimed in claim 1, wherein the first-type doped semiconductor layer is a P-type semiconductor layer, while the second-type doped semiconductor layer is an N-type semiconductor layer.

5. The light emitting diode chip as claimed in claim 1, wherein the active layer is a multiple quantum well (MQW) active layer.

6. The light emitting diode chip as claimed in claim 1, wherein the wall structure is in a form of a continuous pattern.

7. The light emitting diode chip as claimed in claim 1, wherein the wall structure comprises:

a semiconductor epitaxial layer, having a third top surface substantially aligned to the first top surface of the second-type doped semiconductor layer; and a cap layer, at least covering a portion of the third top surface of the semiconductor epitaxial layer.

8. The light emitting diode chip as claimed in claim 7, wherein the cap layer comprises a dielectric layer or a conductive layer.

9. The light emitting diode chip as claimed in claim 7, wherein the cap layer comprises a dielectric layer, and a material of the dielectric layer is substantially the same as a material of the current blocking layer.

10. The light emitting diode chip as claimed in claim 7, wherein the cap layer comprises:

a dielectric layer, wherein a material of the dielectric layer is substantially the same as a material of the current blocking layer; and a conductive layer, disposed on the dielectric layer, wherein a material of the conductive layer is substantially the same as a material of the current spreading layer or a material of the electrodes.

11. The light emitting diode chip as claimed in claim 7, wherein the cap layer comprises:

a dielectric layer, wherein a material of the dielectric layer is substantially the same as a material of the current blocking layer;

a first conductive layer, disposed on the dielectric layer, wherein a material of the first conductive layer is substantially the same as a material of the current spreading layer; and a second conductive layer, disposed on the first conductive layer, wherein a material of the second conductive layer is substantially the same as a material of the electrodes.

12. The light emitting diode chip as claimed in claim 1, wherein the electrodes comprise:

a first electrode, disposed on the first-type doped semiconductor layer that is not covered by the active layer, such that the first electrode is electrically connected with the first-type doped semiconductor layer; and a second electrode, disposed on and electrically connected with the second-type doped semiconductor layer.

* * * * *